United States Patent [19]

Alaspa

[11] 4,127,783
[45] Nov. 28, 1978

[54] REGULATED CONSTANT CURRENT CIRCUIT

[75] Inventor: Allan A. Alaspa, Austin, Tex.

[73] Assignee: Motorola, Inc., Schaumburg, Ill.

[21] Appl. No.: 790,365

[22] Filed: Apr. 25, 1977

[51] Int. Cl.² .......................................... H03K 17/00
[52] U.S. Cl. .................................. 307/297; 307/251; 307/230; 323/9
[58] Field of Search ............... 307/296, 297, 230, 239, 307/251, 252; 323/9, 14, 22

[56] References Cited

U.S. PATENT DOCUMENTS

| | | | |
|---|---|---|---|
| 3,536,988 | 10/1970 | Boynton | 323/9 |
| 3,870,906 | 3/1975 | Hughes | 307/252 |
| 3,909,715 | 9/1975 | Oda | 307/229 |

Primary Examiner—Stanley D. Miller, Jr.
Assistant Examiner—B. P. Davis
Attorney, Agent, or Firm—Walter W. Nielsen

[57] ABSTRACT

A CMOS regulated constant current circuit includes a first reference circuit producing a reference voltage applied to one input of an operational amplifier. The output of the operational amplifier is connected to the gate electrode of a reference field effect transistor having its source connected to ground and its drain connected to the other input of the operational amplifier and to one terminal of a control resistor, the other terminal of the reference field effect transistor being coupled to a plurality of CMOS transmission gates. Each of the CMOS transmission gates can controllably be switched on independently in order to apply the operational amplifier output voltage to a respective one of a plurality of output field effect transistors of the same conductivity type as the reference field effect transistor and each having its source connected to ground. The drains of the output field effect transistors can then be utilized to provide switchable constant currents which can be utilized, for example, to drive light-emitting diodes. The output currents are essentially independent of CMOS manufacturing processing parameters.

9 Claims, 3 Drawing Figures

REGULATED CONSTANT CURRENT CIRCUIT

BACKGROUND OF THE INVENTION

1. Field of the Invention

The invention relates to constant current source devices, especially to CMOS constant current source devices.

2. Brief Description of the Prior Art

A number of integrated circuit decoder driver circuits are available for driving a number of light-emitting diode (LED) devices. For example, the Motorola MC14511 BCD-to-seven segment latch/decoder/driver circuit constructed with CMOS technology is such a device. However, the means for controlling the amount of output current supplied to each LED must be controlled by use of external resistors connected in series with the LED. The requirement for a separate external series resistor to control the brightness of each LED is expensive and inconvenient. Further, the output current delivered by the drivers of the known decoder driver circuits tends to be quite dependent on the integrated circuit manufacturing process parameters, which vary more than is desirable.

SUMMARY OF THE INVENTION

It is an object of the invention to provide a circuit capable of producing a plurality of independently switchable output currents each having a magnitude which is substantially independent of semiconductor manufacturing parameter variations.

It is another object of the invention to provide a circuit capable of producing a plurality of controllably switchable output currents wherein the magnitude of the output currents can all be controlled by adjusting a single resistor.

It is another object of the invention to provide a circuit capable of producing a plurality of controllably switchable output currents having the characteristic that the magnitude of each output current is independent of the number of other output currents which are switched on or off.

Briefly described, the invention is a circuit for producing a switchable output current pulse of controlled magnitude at a first output. The circuit includes a reference circuit for producing a reference voltage, an amplifier having first and second inputs and a second output for amplifying the voltage difference between the first and second inputs and having its first input coupled to the reference circuit. The current generating circuit has its control input coupled to the second input of the amplifier for producing a first current. An output circuit is coupled to the output of the amplifier and includes a first transistor having a control electrode and first and second controlled electrodes. The control electrode is coupled to the amplifier output. The first controlled electrode is coupled to a voltage conductor and the second controlled electrode is coupled to the second input so that substantially all of the first current flows to the first transistor. The output circuit also includes a second transistor having its control electrode selectably coupled to the amplifier output, its first controlled electrode coupled to the second voltage conductor, and its second controlled electrode coupled to the first output.

DESCRIPTION OF THE INVENTION

Figure 1:
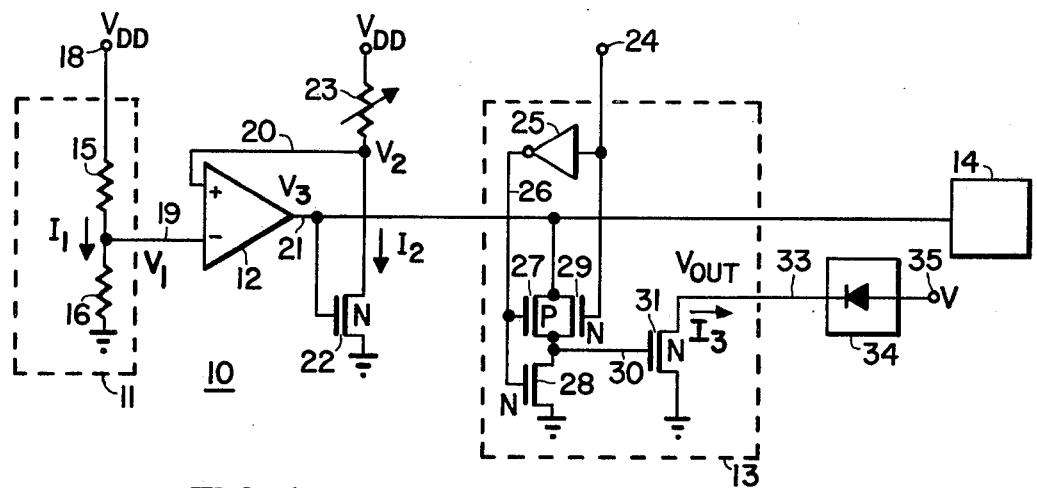
FIG. 1 is a schematic diagram of a presently preferred embodiment of the invention.

Referring to FIG. 1, it is seen that circuit 10 includes a reference circuit 11, which includes resistors 15 and 16 coupled between $V_{DD}$ terminal 18 and ground. The junction 19 between resistors 15 and 16 is connected to one input of amplifier 12, which, for example, may be an operational amplifier. A wide variety of operational amplifiers and bipolar integrated circuit forms are readily available in the market. For example, amplifier 10 could be a Fairchild 709 or one of many variations thereof. Or, more advantageously, in the present invention amplifier 12 could be an integrated circuit CMOS (Complementary Metal Oxide Semiconductor) operation amplifier such as the one incorporated in the Motorola MC14433 A/D converter for the MC14538. Also see U.S. Pat. No. 3,947,778, assigned to the present assignee by Musa et al.

The output of amplifier 12 produces a voltage V3 at conductor 21, which is connected to the gate of N-channel MOSFET 22, which has its source connected to ground and its drain connected to node 20, which is connected to another input of amplifier 12. The voltage at node 20 is designated V2. A variable resistor 23 having a variable resistance $R_c$ is connected between node 20 and $V_{DD}$. A switchable driver circuit 13 includes a P-channel MOSFET 27 and an N-channel MOSFET 29 coupled in parallel between nodes 21 and 30, forming a conventional CMOS transmission gate. The gate of N-channel MOSFET 29 is connected to control conductor 24, which may have a logical "one" or a logical "zero" applied thereto in order to ultimately control whether N-channel MOSFET 31 is turned on in order to deliver a constant current $I_3$ to light-emitting diode 34 or is turned off. Control conductor 24 is connected to the input of inverter 25, which has its output connected to node 26. Node 26 is connected to the gate of P-channel MOSFET 27 and the gate of N-channel MOSFET 28, which has its source connected to ground and its collector connected to node 30. Node 30 is connected to the gate of N-channel MOSFET 31, which has its source connected to ground and its drain connected to output 33, which is connected to the cathode of light emitting diode 34. The anode of light emitting diode 34 is connected to voltage conductor 35, which has a voltage V applied thereto. Node 21 is connected to another switchable circuit 14 which may, for example, be identical to 13.

Figure 2:
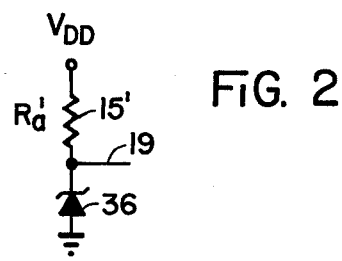
FIG. 2 is diagram of an alternate reference circuit which can be utilized in the embodiments of FIGS. 1 and 3.

FIG. 2 depicts an alternate reference circuit which may be utilized in place of the resistive divider circuit included in 11 of FIG. 1.

Figure 3:
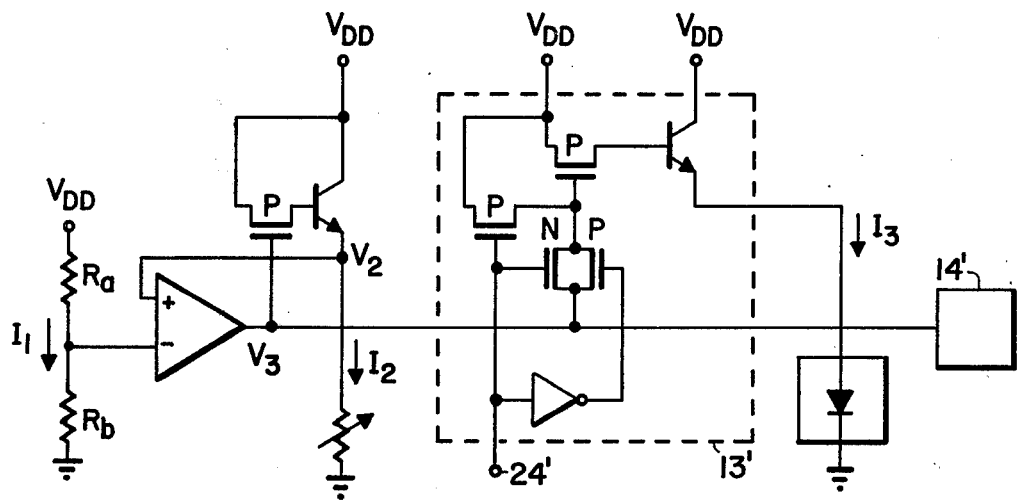
FIG. 3 is a schematic diagram of an alternate embodiment of the invention.

FIG. 3 is an alternate embodiment of the invention wherein bipolar drive devices are utilized instead of MOS drive devices. The circuit has much higher current drive per unit semiconductor area than the MOS version of FIG. 1, but has less accuracy since the saturation characteristic of the P-channel MOSFET is not nearly as constant as the saturation characteristic of the N-channel MOSFET. As a result, the current control, or current "mirroring" is more affected by differences in $V_2$ and $V_{out}$. Matching of the current gain data between the two NPN transistors will be more difficult, and accurate "scaling" of the two NPN transistors in order to obtain current ratios which are equal to the emitter area ratios may be more difficult.

The operation of embodiment of the FIG. 1 is as follows. Resistors 15 and 16 provide a voltage divider action which produces a voltage $V_1$ on node 19. Or, alternatively, if the reference circuit of FIG. 2 is utilized the reverse breakdown voltage of zener diode 36 appears on node 19. The current $I_2$ flowing through resistor 23 and N-channel MOSFET 22 is controlled by adjusting the value $R_c$ of resistor 23. The feedback from node 20 causes operational amplifier 12 to produce a voltage $V_3$ at its output which will equalize $V_1$ and $V_2$. If the voltage on control conductor 24 is a logical "one", i.e., is at $V_{DD}$ volts, then N-channel MOSFET 29 will be on, a logical "zero" will be at node 26, and P-channel MOSFET 27 will also be "on", and N-channel MOSFET 28 will be "off", so that the voltage $V_3$ will be applied to the gate of N-channel MOSFET 31. Since MOSFETs 22 and 31 will both have the same gate-to-source voltage, and since they will both be in their saturation region, the ratio of the currents $I_3$ and $I_2$ will be the same as the ratio of the channel width to channel length ratios of the two MOSFETs, respectively. Thus, it can be seen that the current $I_3$ driving light-emitting diode 34 is a multiple of the current $I_2$, set by adjusting resistor 23, and will be quite independent of CMOS manufacturing parameters such as threshold voltage and surface conductivity, etc. It can be seen that if the voltage on control conductor 24 is switched to a logical "zero", then MOSFETs 27 and 29 will be "off" and N-channel MOSFET 28 will be "on", grounding the voltage at node 30 and turning output MOSFET 31 off, thereby turning off the light-emitting diode 34. As many additional switching driver circuits identical to 13 can be added as is desired. The same voltage $V_3$ will then be applied to the gate of the output MOSFET 31 of each such additional switching driver circuit. It can be readily seen that the magnitude of the current $I_3$ for each of such driver circuits will be a function of $R_c$, the resistance of resistor 23. Thus, it is seen that the brightness of all of the light-emitting diodes can be controlled by the adjustment of the single resistor 23. It is also readily observed that the brightness of any particular light-emitting diode is totally independent of how many of the other light-emitting diodes driven by the system are switched on or off.

Preferably, the entire circuit shown in FIG. 1, and including as many switchable driver circuits as desired, but not including the light-emitting diodes 34, may be included on a single CMOS chip.

It will be apparent to those skilled in the art that the disclosed Regulated Constant Current Circuit may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. A circuit for producing a switchable output current pulse of controlled magnitude at a first output, said circuit comprising:
   (a) a reference means for providing a reference voltage;
   (b) amplifier means having first and second inputs and a second output for amplifying the voltage difference between said first and second inputs, said first input being coupled to said reference means;
   (c) means coupled to said second input for producing a first current;
   (d) an output circuit coupled to said second output including
       (1) a first transistor having a control electrode and first and second controlled electrodes, said control electrode being coupled to said second output, said first controlled electrode being coupled to a voltage conductor, and said second controlled electrode being coupled to said second input, so that substantially all of said first current flows through said first transistor; and
       (2) a second transistor having a control electrode selectably coupled to said second output, a first controlled electrode coupled to said voltage conductor, and a second controlled electrode coupled to said first output; and
   (e) switching means responsive to a control input for selectively coupling said control electrode of said second transistor to said second output.

2. The circuit as recited in claim 1 wherein said switching means comprises a CMOS transmission gate including an N-channel MOSFET having its gate electrode coupled to said control input, an inverter having its input connected to said control input and its output connected to the gate of a P-channel MOSFET included in said CMOS transmission gate, and further including an N-channel MOSFET having its gate connected to the output of said inverter and its source connected to said voltage conductor and its drain connected to the control electrode of said second transistor.

3. The circuit as recited in claim 1 wherein said means for producing said first current comprises a resistor coupled between a second voltage conductor and said second input.

4. The circuit as recited in claim 3 wherein said resistor is an adjustable resistor.

5. The circuit as recited in claim 1 including a plurality of said output circuits coupled to said second output, said circuit also including a plurality of said first outputs, the second controlled electrode of said second transistor of each of said output circuits being coupled to a respective one of said plurality of first outputs.

6. The circuit as recited in claim 1 further including a light-emitting diode coupled between said first output and a third voltage conductor.

7. The circuit as recited in claim 1 wherein said reference means, said amplifier means and said means coupled to said second input are all provided on a single integrated circuit die.

8. The circuit as recited in claim 1 wherein said first and second transistors are both field effect transistors.

9. The circuit as recited in claim 1 wherein said first and second transistors are both bipolar transistors.

* * * * *